United States Patent
Chen

(10) Patent No.: US 6,797,987 B2
(45) Date of Patent: Sep. 28, 2004

(54) HIGH EFFICIENCY LIGHT EMITTING DIODE AND METHOD OF MAKING THE SAME

(75) Inventor: Tzer-Perng Chen, Hsinchu (TW)

(73) Assignee: United Epitaxy Co., Ltd., Hsinchu (TW)

( * ) Notice: Subject to any disclaimer, the term of this patent is extended or adjusted under 35 U.S.C. 154(b) by 0 days.

(21) Appl. No.: 10/334,983

(22) Filed: Jan. 2, 2003

(65) Prior Publication Data

US 2003/0164503 A1 Sep. 4, 2003

(30) Foreign Application Priority Data

Mar. 4, 2002 (TW) .......................... 91103965 A

(51) Int. Cl.⁷ .............................................. H01L 33/00
(52) U.S. Cl. ........................ 257/98; 257/81; 257/79; 257/99; 257/100; 257/103
(58) Field of Search .................. 257/79, 85, 14, 257/98, 99, 103, 91, 96, 81, 100; 373/498

(56) References Cited

U.S. PATENT DOCUMENTS 5,351,255 A * 9/1994 Schetzina ..................... 372/45
6,222,207 B1 * 4/2001 Carter-Coman et al. ...... 257/98
6,522,063 B2 * 2/2003 Chen et al. ................. 313/498

* cited by examiner

*Primary Examiner*—Minhloan Tran
*Assistant Examiner*—Tan Tran
(74) *Attorney, Agent, or Firm*—Troxell Law Office PLLC

(57) ABSTRACT

A light emitting diode with high efficient reflective metal layer is disclosed. To prevent the reflective metal layer from reacting with the epi-LED layer structure during a thermal annealing process, a transparent electrical-conductive oxide layer such as ITO is formed in between them. Four preferred embodiments are proposed to improve the ohmic contact between the ITO layer and the epi-LED layers. There are: forming ohmic contact grid pattern, or ohmic contact channels in the ITO layer, or thin GaAs layer, or thin transparent metal layer at the interface between the ITO and the epi-LED layers.

11 Claims, 6 Drawing Sheets

HIGH EFFICIENCY LIGHT EMITTING DIODE AND METHOD OF MAKING THE SAME

BACKGROUND OF THE INVENTION

1. Field of the Invention

The present invention relates to a high efficiency light emitting device, and more particularly to a III–V compound semiconductor light emitting diode with a highly reflective metal reflector therein to avoid the light absorption by the substrate.

2. Description of the Prior Art

The conventional AlGaInP LED, as shown in FIG. 1, has a double heterostructure (DH), which consisted of an n-type $(Al_xGa_{1-x})_{0.5}In_{0.5}P$ lower cladding layer 3 with an Al composition of about 70%–100%, formed on an n-type GaAs substrate 1, an $(Al_xGa_{1-x})_{0.5}In_{0.5}P$ active layer 5 with an Al composition of 0%–45%, a p-type $(Al_xGa_{1-x})_{0.5}In_{0.5}P$ upper cladding layer 7 with an Al composition 70%–100% and a p-type high energy bandgap current spreading layer 9 such as layers of GaP, GaAsP, AlGaAs, or ZnO. However, the portion of the light emits from the active layer 5 towards the substrate will be totally absorbed by GaAs substrate 1. Therefore, the external quantum efficiency of this kind of conventional AlGaInP LED is small. Besides, the thermal conductivity of GaAs is only about 44 W/m-° C. The low thermal conductivity of the GaAs substrate 1 is not good enough to dissipate the heat generated.

To overcome the substrate absorption problem, several conventional LED fabrication technologies have been disclosed. However, those conventional technologies still have several disadvantages and limitations. For example, Sugawara et al. disclosed a method published in Appl. Phys. Lett. Vol. 61, 1775–1777 (1992), The LED structure is similar to the FIG. 1, thus, in FIG. 2, the similar function layers are labeled with the same reference numerals. Sugawara et al. added a distributed Bragg reflector (DBR) layer 2 in between the GaAs substrate 1 and lower cladding layer 3 so as to reflect those light emitted toward the GaAs substrate 1, as shown in FIG. 2. Further they added a blocking layer 10 to enhance current spread. However, the maximum reflectivity of the DBR layer 2 used in AlGaInP LED is only about 80% and the reflectivity thereof also depends on the reflection angle. The DBR layer 2 can only effectively reflect the light vertically emitted towards the GaAs substrate 1, so that the improvement of external quantum efficiency is limited.

Kish et al. disclosed a wafer-bonded transparent-substrate (TS) $(Al_xGa_{1-x})_{0.5}In_{0.5}P/GaP$ light emitting diode [Appl. Phys. Lett. Vol. 64, No. 21, 2839 (1994); Very high efficiency semiconductor wafer-bonded transparent-substrate $(Al_xGa_{1-x})_{0.5}In_{0.5}P/GaP$]. As shown in FIG. 3, a transparent-substrate 13 (TS) is replaced for the GaAs absorption substrate (not shown). The TS AlGaInP LED was fabricated by growing a very thick (about 50 um) p-type GaP window layer 11 formed atop epi-layers light emitting structure 12 (0.75 $\mu$m p-type cladding layer 3 of $Al_{0.5}In_{0.5}P$/active layer 5 of $(Al_xGa_{1-x})_{0.5}In_{0.5}P$/1 $\mu$m n-type cladding layer 7 of $Al_{0.5}In_{0.5}P$ with GaAs as temporary substrate) by using hydride vapor phase epitaxy (HVPE). Subsequently, the temporary n-type GaAs substrate was selectively removed using conventional chemical etching techniques. After removing the GaAs substrate, the LED epilayer structure 12 is then bonded to an 8–10 mil thick n-type GaP substrate 13. The resulting TS AlGaInP LED exhibits two times improvement in light output compared to absorbing substrate (AS) AlGaInP LEDs. However, the fabrication process of the TS AlGaInP LED is too complicated. Therefore, it is difficult to manufacture these TS AlGaInP LEDs in high yield and low cost.

Another conventional technique is shown in FIG. 4. The schematic diagram, which is proposed by Haitz et al., in U.S. Pat. No. 5,917,202. The light emitting diode epi-layers 40 included active layer 41 and n-type GaP 45$p$ and P-type GaP 43, are prepared. Thereafter a reflective metal layer 47 with zinc, germanium or the like doped and an n-type electrode 47$a$, which can be made from the same material as reflective metal layer 47, is formed on both the upper and bottom surface. After that, a pulse laser beam is then utilized to heat some predetermined spots so as to form alloy spots 49 by reacting the reflective metal layer 47 with the p-type GaP 43, and reacting the n-type electrode 17$a$ with the n-type GaP 45. The alloy spots 49 are in a form of grid pattern. The pitch between two neighbor alloy spots 49 and the spot size itself rely on the current effectively spreading area from each alloy spot 49.

In terms of alloy spots, ohmic contacts are formed. The process skips a high temperature thermal anneal in the furnace. However, the product yield depends on the burn-in scan rate by the laser beam. And hence, the product rate is limited. Moreover, any high temperature process in the post-process is still inhibited.

Another embodiment of Haitz's is shown in FIG. 5. The processes are as follows. The light emitting epi-layers are first adhered to a transparent substrate 52. Next, a dielectric layer 53 is formed on the transparent 52. Afterward, a lithographic and an etch process are successively carried out to form a plurality of contact channels 54. An ohmic contact metal refilled process is then followed. The contact channels make the current flow from the n-electrode to the p-electrode without being interrupted. However, the processes are still complicated. Furthermore, it degrades the performance under high current flow and any thermal process because the dielectric layer 52 is an insulator for both heat and electrical-conductive properties.

An object of the present is thus to provide a method of making a light emitting diode with a high efficient reflective metal.

SUMMARY OF THE INVENTION

The present invention disclosed a method of fabricating a light emitting diode with a high efficient reflective metal layer. To prevent the reflective metal layer from reacting with the epi-LED layer structure during a thermal process, a transparent electrical-conductive oxide layer such as a layer of $In_2O_3$, $SnO_2$, CdO, ZnO, ITO, CTO, $CuAlO_2$, $CuGaO_2$, or $SrCu_2O_2$ is formed in between them. A reflective metal formed on the transparent electrical-conductive oxide layer is then followed. After that, a silicon-base substrate is bonded to the reflective metal layer through a metal bonding layer. Finally, a removal of the temporary substrate from the LED epi-layers, a step of formation an n-electrode and an annealing process are sequentially carried out.

Four preferred embodiments are proposed to improve the ohmic contact between the ITO layer and epi-LED layers.

In the first preferred embodiment, an ohmic contact grid pattern is formed in the transparent electrical-conductive oxide layer and is adjacent to the interface between the transparent electrical-conductive oxide layer and the p-type ohmic contact layer of the LED epi-layers.

In the second preferred embodiment, a thin film layer selected from III–V group compound, of which energy bandgap is small, is formed on the ohmic contact layer of the LED epi-layers before step of forming transparent electrical-conductive oxide layer to improve the ohmic contact between the ITO layer and epi-LED layers. Afterwards, the process steps are as depicted before, In the third preferred embodiment according to the present invention, which modified from the second preferred embodiment a thin transparent metal layer is replaced for the low bandgap III–V group compound semiconductor layer.

In the fourth preferred embodiment, a plurality of ohmic contact channels is formed in the ITO layer to play the role of the ohmic contact improvement between the ITO layer and epi-LED layers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

As described above, although a DBR layer used in the conventional AlGaInP LEDs though can reflect those lights emitting toward the substrate. However, the reflective efficiency is significantly depends on the injection angle, as a result the brightness improvement is limited. Using the reflective metal replaced for the DBR layer resolves the problem of reflect angle, but the resulting structure can not be processed in any high temperature so as to prevent the reflective metal layer from reacting with the LED-epi-layers. The patent of Haitz's proposed a dielectric layer to prevent the reflective metal layer direct contact with III–V group epi-layers in LED-structure, but the processes are still complicate and the resulting LED can't sustain large current density due to the insulating property of the dielectric layer.

Hence, the motivation of the present invention is to propose four preferred embodiments which can overcome aforementioned problems.

Figure 1:
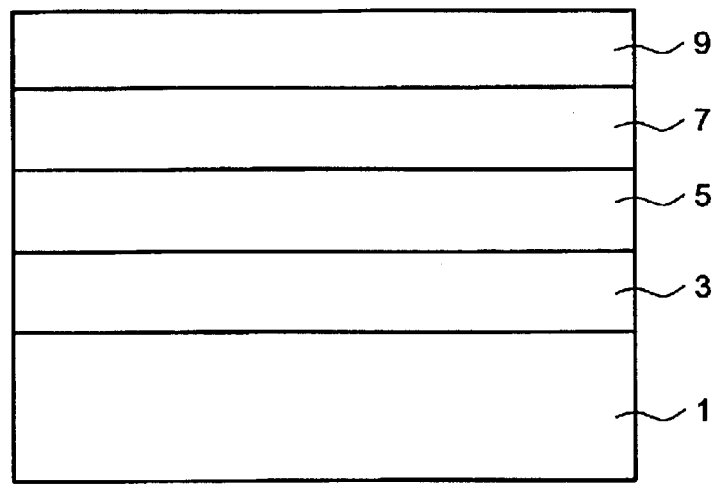
FIG. 1 shows a schematic cross-sectional view of a conventional light emitting diode.
Figure 2:
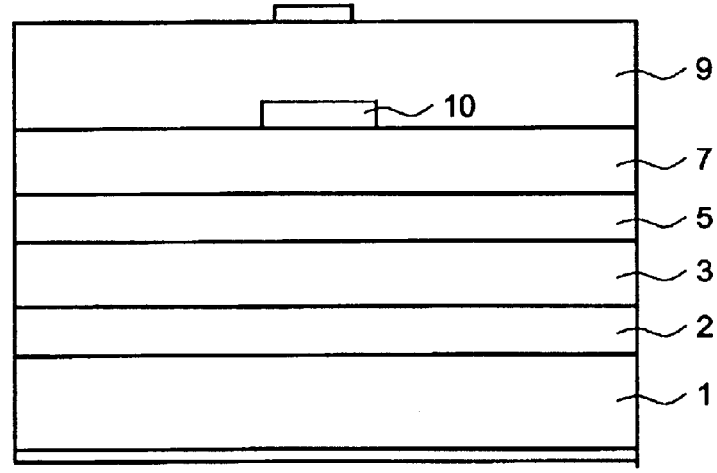
FIG. 2 shows a light emitting diode with a DBR layer to reflect the light emitted from the active layer.
Figure 3:
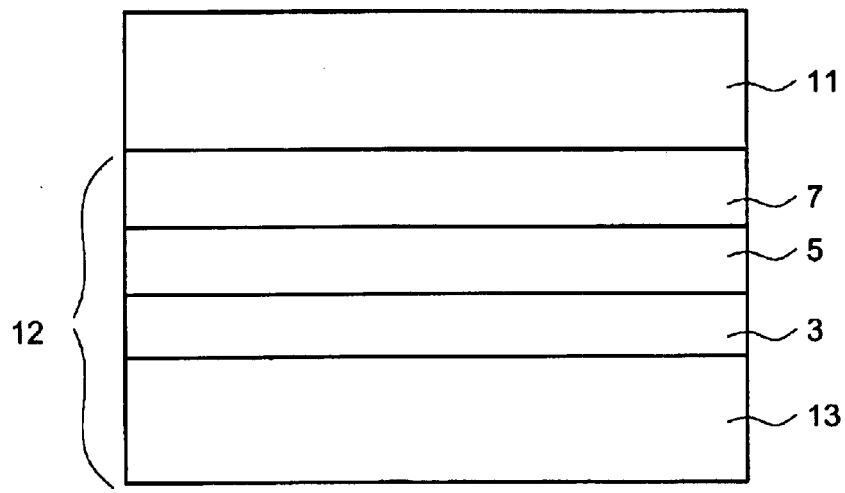
FIG. 3 shows a light emitting diode formed with a transparent substrate made by wafer bonding technology.
Figure 4:
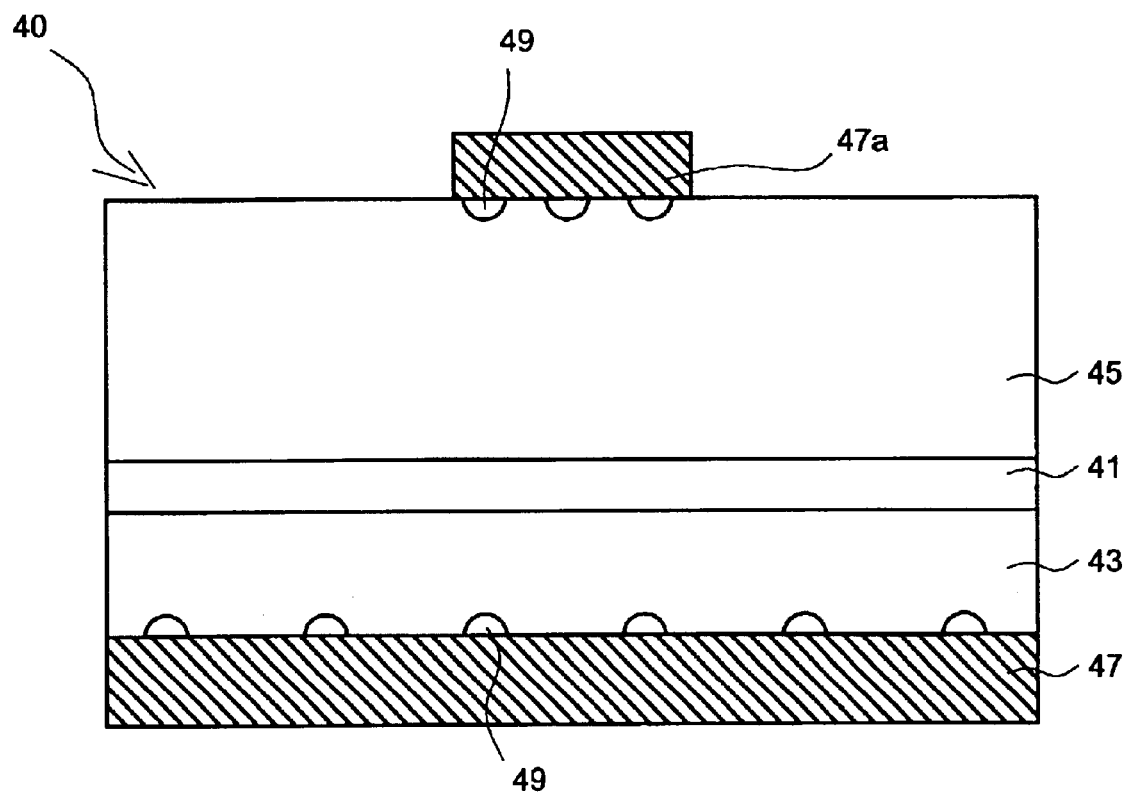
FIG. 4 shows a light emitting diode with ohmic contact spots formed by reacting the reflective metal layer with n-type GaP using pulse laser heating in accordance with prior art.
Figure 5:
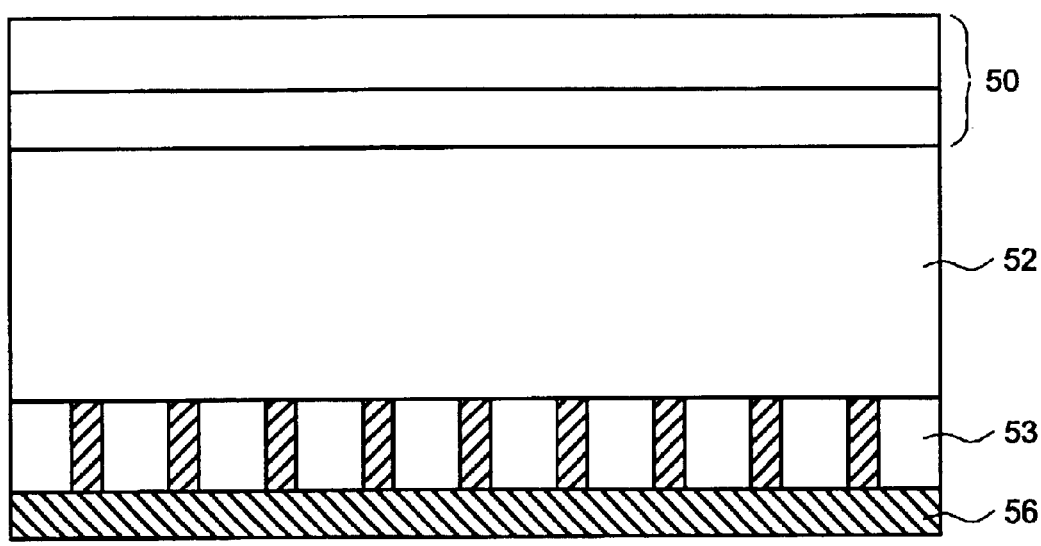
FIG. 5 shows a light emitting diode with a dielectric layer formed in between the light emitting epi-layers and the reflective metal layer and prevent reaction of theirs, wherein the dielectric layer has a plurality of ohmic contact channel to conduct the current in accordance with prior art.
Figure 6A:
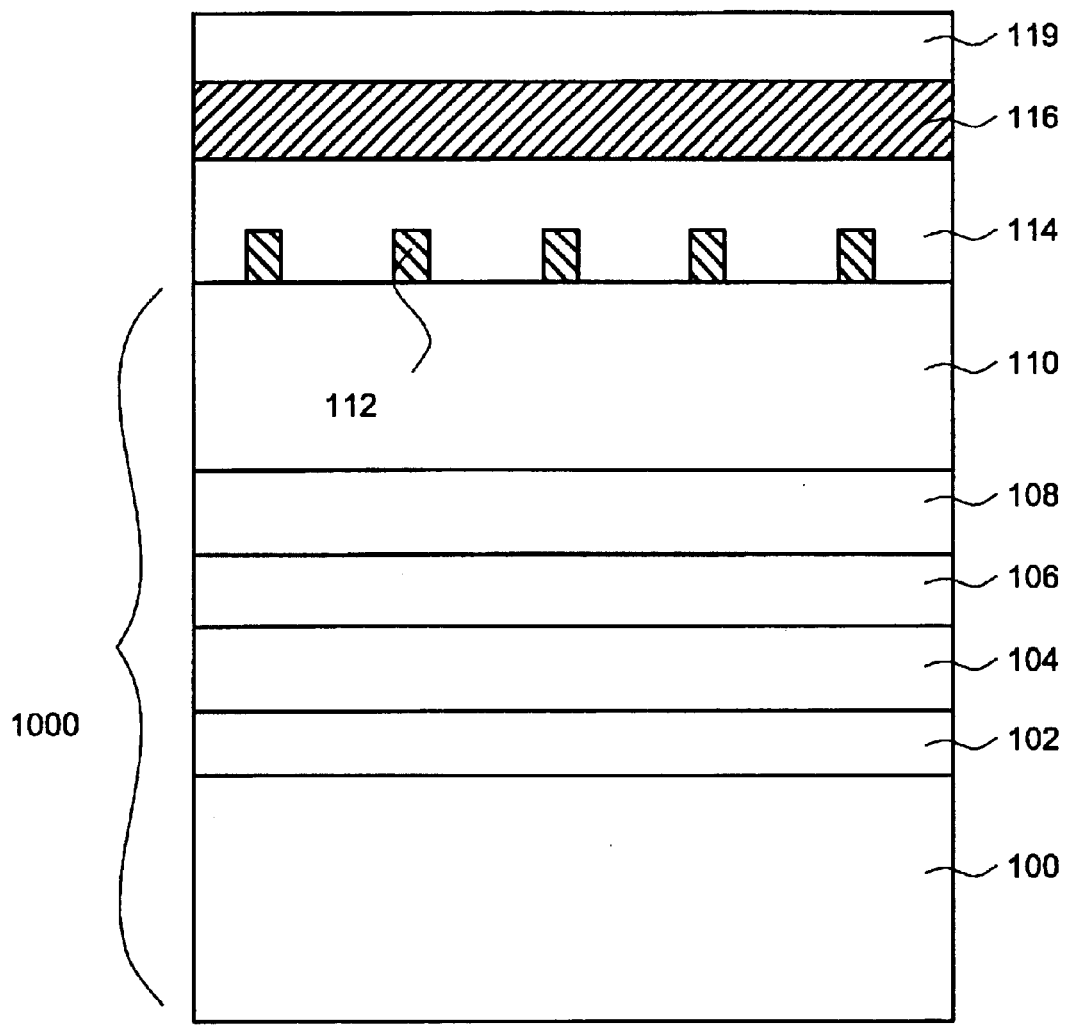
FIGS. 6A–6C shows a series of schematic views of an AlGaInP light emitting diode structure before bonding a transparent substrate to a LED epi-layers 6A, and 6B and post bonding 6C, according to the first preferred embodiment of the present invention.

Referring to FIG. 6A, an epitaxial structure 1000 of a light emitting structure sequentially consists of from a bottom thereof a temporary GaAs substrate 100, an etching stop layer 102, an n-type $(Al_xGa_{1-x})_{0.5}In_{0.5}P$ lower cladding layer 104 with an Al composition of about 50%–100%, an $(Al_xGa_{1-x})_{0.5}In_{0.5}P$ active layer 106 with an Al composition of about 0%–45%, a p-type $(Al_xGa_{1-x})_{0.5}In_{0.5}P$ upper cladding layer 108 with an Al composition of about 50%–100%, and a p-type ohmic contact layer 110. While the active layer is with 0% of Al, the wavelength of the light emitted from LED is of about 635 nm.

The material of the etching stop layer 102 can be selected from any III–V compound semiconductor material that has a lattice matched with that of the GaAs substrate 100 so as to reduce the density of dislocation. Another condition of etching stop layer 102 has to meet is the etching rate. The etching stop layer 102 should has an etch rate much smaller than that of the GaAs substrate 100 while using an etchant mixture such as $5H_3PO_4:3H_2O_2:3H_2O$ or $1NH_4OH:35H_2O_2$, to remove GaAs substrate 100. For example, GaInP or AlGaAs can be as a good candidate for the etching stop layer 102. The etching stop layer 102 must also have a high carrier concentration in order to form ohmic contact easily. The preferred carrier concentration of the etching stop layer 102 is higher than $1\times10^{18}$ cm$^{-3}$.

The p-type ohmic contact layer 110 (hereafter called transparent ohmic contact layer 110) should have a high transparency to light emitted by the active layer 106 and thus must have an energy band gap larger than that of the active layer 106. The transparent ohmic contact layer 110 must also have a high carrier concentration therein in order to form a lower resistance ohmic contact. Preferably, the transparent ohmic contact layer 110 can be any III–V compound of semiconductors which satisfy forgoing conditions. For example, LED with light emitting in a wavelength range of about 590 nm–650 nm, AlGaAs or GaAsP is a good choice as the material of p-type ohmic contact layer 110. In case of wavelength up to 560 nm, a GaP layer is good candidate. The carrier concentration of transparent ohmic contact layer 110 higher than $1\times10^{18}$cm$^{-3}$ is preferred.

Thereafter, a p-type ohmic contact metal grid pattern or mesh pattern 112 (hereinafter called ohmic contact metal patterned layer 112), such as Au—Be, Au—Zn, or Cr—Au, is formed on the p-type ohmic contact layer 110 so as to further prompt the current distributed evenly. The density of the grid spot in grid pattern or mesh pattern 112 is high or low depends on the lateral current distribution area of each grid point or each mesh ohmic contact. The factors which affect the lateral current distribution area rely on the thickness of the transparent ohmic contact layer 110 and its resistivity thereof. For example, the thicker the transparent ohmic contact layer 110 is, the less dense the grid point is, vice versa. Moreover, the smaller resistivity of the transparent ohmic contact layer 110 implies each ohmic contact grid point can have a larger current distribution area. Consequently, it can reduce the number of the ohmic contact grid point. The higher coverage ratio of ohmic contact metal patterned layer 112 will reduce the light output but it will reduce the forward voltage of light emitting diode. Thus, to compromise between the light output and contact resistance, the coverage ratio of ohmic contact metal patterned layer 112 less than 10% is preferred.

The ohmic contact metal patterned layer 112 is formed either through the steps sequence of forming a p-type ohmic contact metal layer atop the p-type ohmic contact layer 110, forming a photoresist pattern, and performing an etching step to pattern the p-type ohmic contact metal layer and performing the photoresist removal or through the steps sequence of forming a photoresist with a grid or a mesh pattern, depositing a p-type ohmic contact metal layer, and then performing a lift off step to remove the portion of poor bonding metal layer and striping the photoresist finally.

Thereafter, the resulting LED structure is then annealed in a high temperature of about 350–600° C. to achieve lower contact resistance. Then a transparent electrical-conductive oxide layer 114 and a highly reflective metal layer 116 are successively deposited on the transparent ohmic contact layer 110. The transparent electrical-conductive oxide layer 114 according to the invention is selected from one of the materials that have high conductivity, good transparency and little reaction with reflective metal layer 116 even in a high temperature. For example, $In_2O_3$, $SnO_2$, CdO, ZnO, ITO, CTO, $CuAlO_2$, $CuGaO_2$, and $SrCu_2O_2$ are good candidates. The highly reflective metal layer 116 can be selected from Au, Al or Ag. These three metals all have reflectivity higher than 90% in the wavelength range from 560 nm to 650 nm. The major improvement of the present invention is the adoption of this transparent electrical-conductive oxide layer 114 as immune to prevent the reflective metal layer 116 from reaction with the transparent ohmic contact layer 110. Normally, the reflective metals such as Au, Al, or Ag will react with most of the III–V compound semiconductor materials in high temperature. The higher the temperature anneal, the more serious the reaction is. When the reflective metal 116 reacted with the high conductivity transparent ohmic contact layer 110, the reflectivity of the reflective metal layer 116 will degrade. Adding an inert transparent electrical-conductive oxide layer 114 such as an ITO layer in between can totally avoid the interaction between the reflective metal 116 and the transparent ohmic contact layer 110. Therefore, the reflectivity of the highly reflective metal layer 116 will not degrade during any high temperature processing.

Figure 6B:
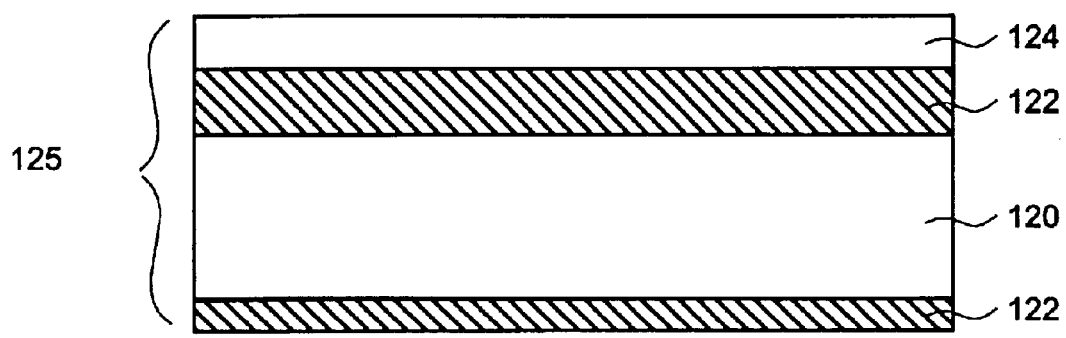

Subsequently, the AlGaInP LED epi-wafer 118 is then be adhered to another high thermal and electrical-conductive substrate 125. A lot of semiconductors, ceramic, and metals such as Si, SiC, AlN, copper, and aluminum are good candidates for serving as the conductive substrate 125. Especially, the silicon wafer is cheaper and more easily to be lapped, polished and diced. Therefore, the silicon substrate of heavily doped with conductive impurities is preferred, as is shown in FIG. 6B. The silicon substrate 120 is then coated a metal layer on both sides of silicon substrate 120 to form ohmic contacts, 122. Then, either one side of the ohmic contact metal 122 will adhere with the AlGaInP LED epi-wafer 118 by a metal bonding layer 124. The metal bonding layer 124 is one selected from solder or metals or metal silicide such as PbSn, AuGe, AuBe, AuSi, Sn, In, AuIn and PdIn. The metal bonding layer 124 is required to provide enough adhesion strength and current conduction. To avoid the reaction between the metal bonding layer and the highly reflective metal layer 116, another diffusion barrier layer 119 can be optionally deposited on the highly reflective metal layer 116. The diffusion barrier layer 119 can be a conductive oxide layer such as ITO, CTO and ZnO or a high melting temperature metal layer such as a layer of W, WN, Mo, or silicide.

In case of without the diffusion barrier layer 119, the highly reflective metal layer 116 should have a thickness higher than that of with a diffusion barrier layer 119. Furthermore, the metal bonding layer 124 formed on the ohmic contact metal 122 is for illustration, as shown in FIG. 6B, rather than give a limitation. For example, the metal bonding layer 124 can be formed either on the diffusion barrier layer 119 or on the reflective metal layer 116 before performing the bonding process. Still, the ohmic contact metal 122 of the conductive substrate 120 bonded with reflective metal layer 116 can be without the metal bonding layer 116, if the selected ohmic contact metal 122 or alloy itself has a lower melting point. It for sure, after bonding the metal bonding LED structure should be still stuck firmly during wire bonding process.

Figure 6C:
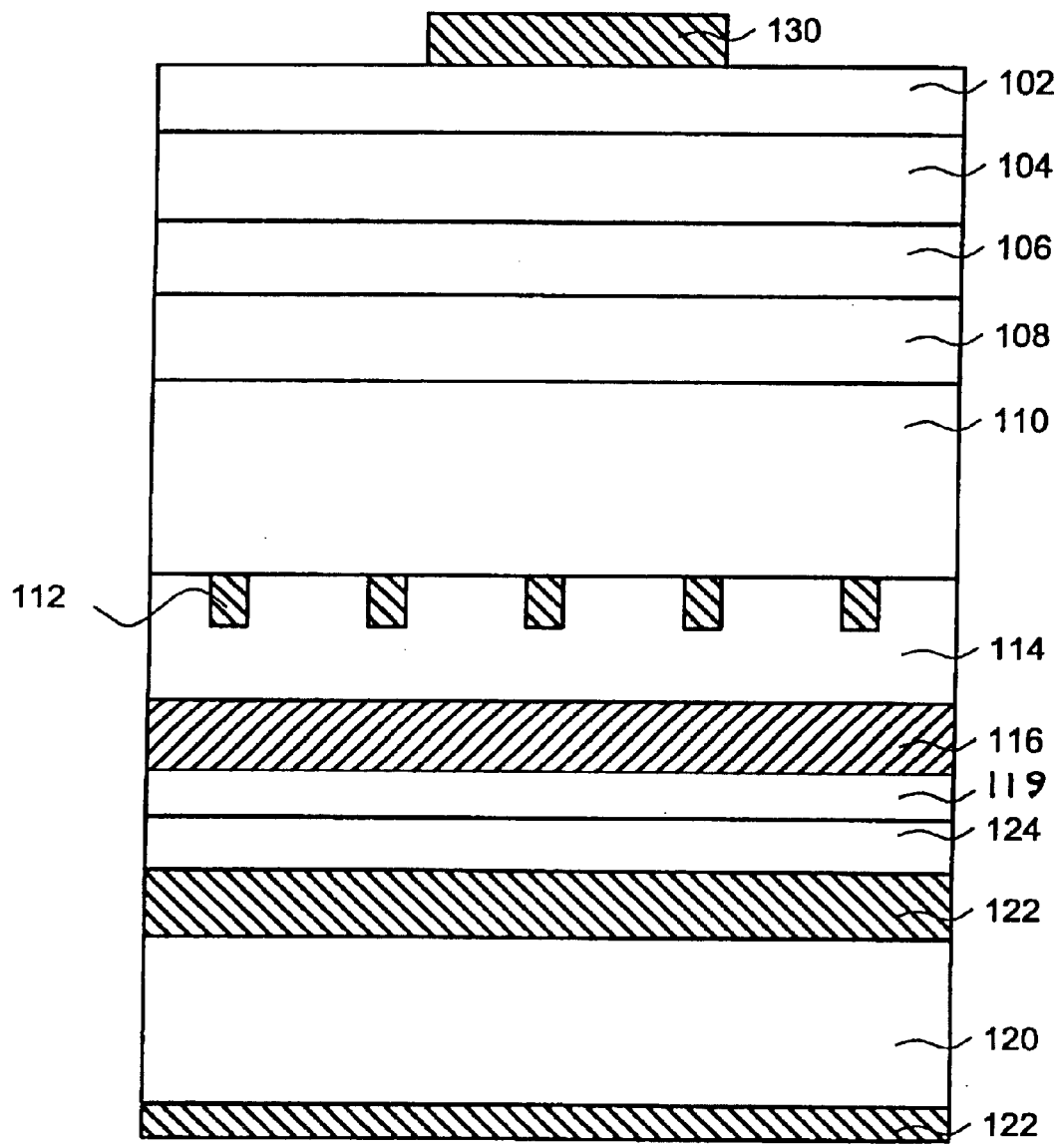

After bonding, the absorption GaAs substrate 100 is removed by mechanical lapping, chemical etching, such as using chemistries $5H_3PO_4:3H_2O_2:3H_2O$ or $1NH_4OH:35H_2O_2$, or by reactive ion etching (RIE), using etch stop layer 102 as a stop layer. Then, an n-type ohmic contact 130 to be an electrode is deposited on the etching stop layer 102 and annealed to complete AlGaInP light emitting diode fabrication. The results LED cross-sectional view is shown in FIG. 6C. The AlGaInP light emitting diode is with good heat dissipation properties for a vertically current conduction.

The luminous efficiency of the AlGaInP LED according to the present invention is over 30 lm/W for the wavelength in a range between 585 nm and 630 nm. The brightness of the present invention AlGaInP LED also increases linearly with injection current even above 100 mA. It proves that the Si wafer provides a much better heat dissipation capability than GaAs substrate. The present invention not only applied to AlGaInP LED but also can be applied to other LEDs such as AlGaAs LED, InGaAsP LED, AlGaInN LED or VCSEL devices (vertical cavity surface emitting laser).

As forgoing depicted in the first preferred embodiment, the transparent electrical-conductive oxide layer 114 formed between the reflective metal layer 116 and the LED epi-layer 1000 is to prevent the LED epi-layer 1000 from reacting with the reflective metal layer 116. The current injected into the transparent electrical-conductive oxide layer 114 can be spread uniformly in the LED epi-layer 1000 through the ohmic contact mesh or grid layer 112 without inhibiting by the energy barrier in the junction of the transparent electrical-conductive oxide layer 114 and the LED epi-layer 1000.

Figure 7:
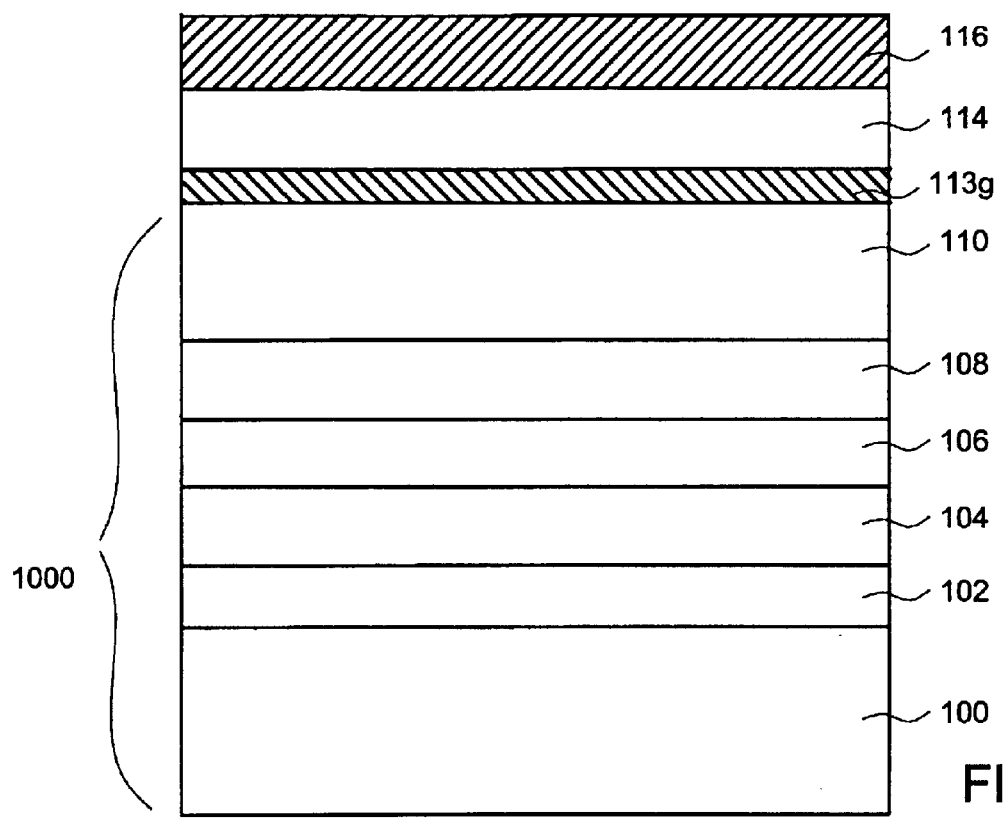
FIG. 7 shows a schematic view of a light emitting epi-layers with a thin GaAs layer to improve the ohmic contact property between the transparent electrical conductive-oxide layer and p-type ohmic contact layer of LED epi-layers according to the second preferred embodiment of the present invention.

The structure amid aforesaid LED epi-layer 1000 and the transparent electrical-conductive oxide layer 114 can also be modified as follows. Please refer to FIG. 7, a second preferred embodiment in accordance with the present invention. A thin film 113g with an energy bandgap smaller than that of the active layer of the LED epi-layers 1000 is formed on the LED epi-layer 1000, prior to form a transparent electrical-conductive oxide layer. The thin film 113g is to generate good ohmic contacts for transparent electrical-conductive oxide layer upon the LED epi-layer. Take AlGaInP LED as an example, the thin film can be a GaAs thin film 113g or a GaAsP film 113g with P between 0% and 30%.

First of all, a GaAs thin film 113g or a GaAsP thin film 113g is formed on the surface 110 of the LED epi-layer 1000 which includes temporary substrate 100. Therefore, a transparent electrical-conductive oxide layer 114 and a reflective metal layer 116 are sequentially deposited. After that, a series of the processes, including the bonding process of the reflective metal layer 116 is bonded to the electrically & thermal conductive substrate, and process of removing the temporary substrate 100 and forming an n-type electrode 130 and end up with the anneal process are the same processes as the first preferred embodiment. As depicted before, the energy bandgap film, as GaAs or GaAsP will have the light absorption problem. However, the thin GaAs or GaAsP can dope with higher carrier concentrations than the III–V compound semiconductor film with larger energy bandgap. In general, to prevent the light absorption, the material of the high energy bandgap such as GaP is selected as a p-type ohmic contact film of the LED epi-layers 1000, as depicted in the first preferred embodiment. As a result, the carrier concentration can not be allowed doped with high concentration. On the contrary, the small energy bandgap as thin GaAs film 113g can dope with carrier concentrations up to $1 \times 10^{19}/cm^3$. It's sufficient to provide a good ohmic contact which requires typically $5 \times 10^{18}/cm^3$ in carrier concentration. Consequently, an vertical current flow from the electrical & heat conductive substrate 125, reflective metal layer 116 to the transparent electrical-conductive oxide layer 114 through thin GaAs film layer 113g can be distributed uniformly and then injected into the LED epi-layer 1000 to the n-type electrode 130. Even though the thin GaAs film layer 113g has the advantage of current distributed uniformly, it still has to limit its thickness or the drawback of light absorption will over aforesaid advantage.

Figure 8:
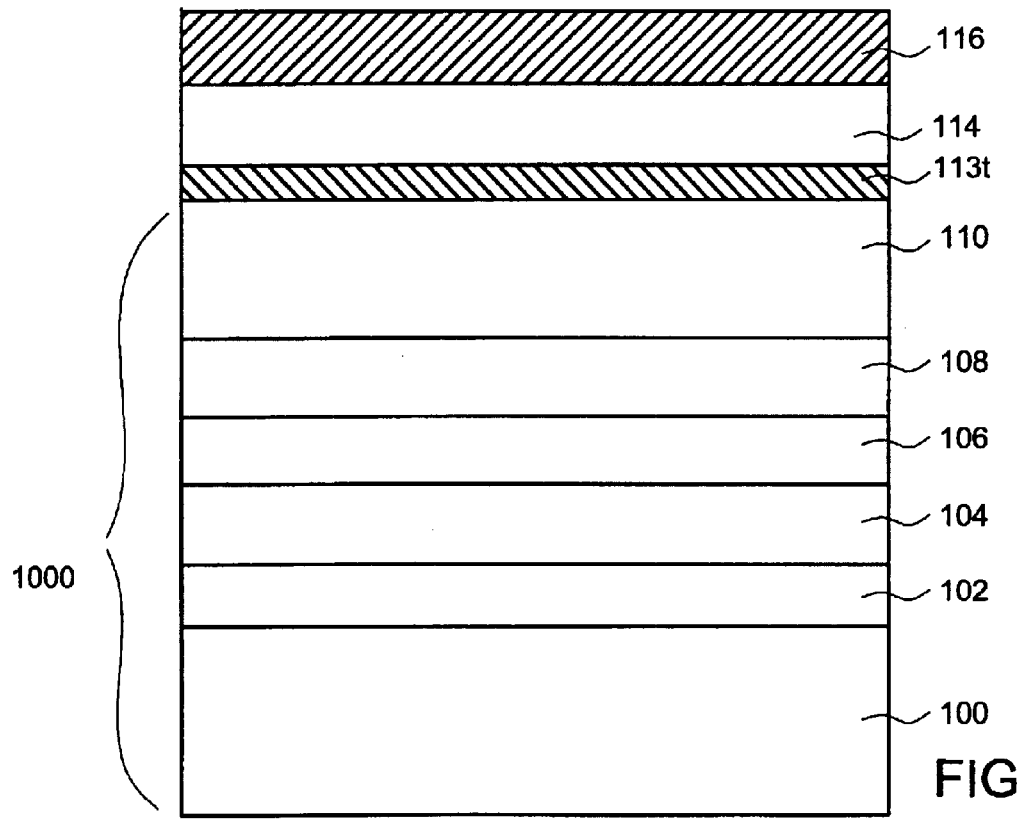
FIG. 8 shows a schematic view of a light emitting epi-layers with a thin transparent metal layer as to improve the ohmic contact property between transparent electrical conductive-oxide layer with p-type ohmic contact layer of LED epi-layers according to the third preferred embodiment of the present invention.

The thinner the GaAs layer has, the more transparency of the light will be. With sacrificing a small portion of the light emitted to attain uniform current distributed is usually deserved. For attaining good ohmic contact so as to bring about current uniform distribution, a third preferred embodiment is provided, as is shown in FIG. 8. A transparent conductive layer (TCL) such as a thin metal film 113t is deposited firstly on the LED epi-layer 1000 before forming transparent electrical-conductive layer, as the thin GaAs film in second preferred embodiment. The TCL film 113t can be as thin as 15 nm (below 10 nm is more preferred) and is selected from Au/Ni layer or Au/Be or Au/Zn composite film which makes the transparent electrical-conductive oxide layer form a good ohmic contact layer. For such thickness of the TCL film 113t, it is transparent without sacrificing too much portion of light while the light inject to the reflective metal film and fro.

Figure 9:
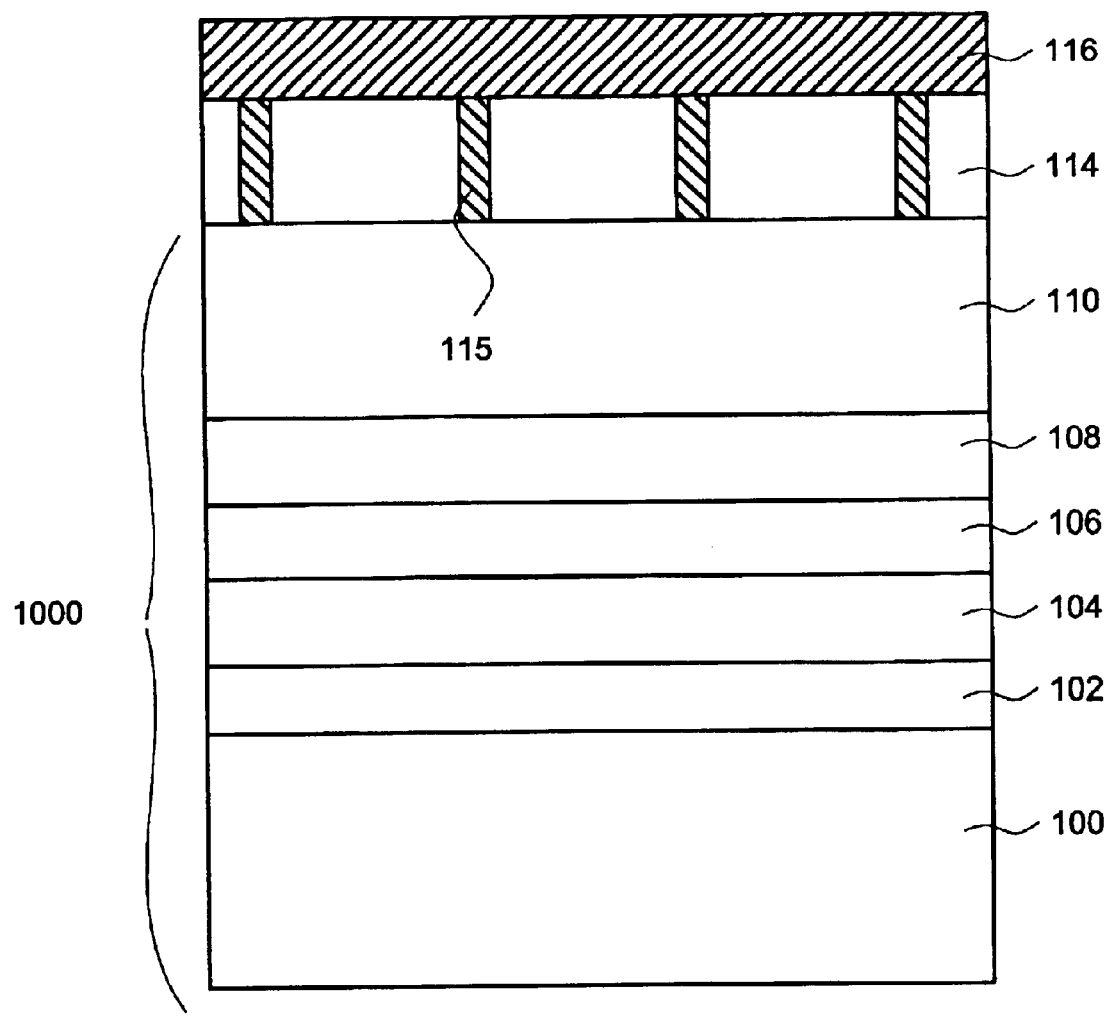
FIG. 9 shows a schematic view of a light emitting epi-layers with a plurality of contact channel penetrated through the transparent electrical-conductive oxide layer in according to the present invention.

The fourth embodiment according to the present invention is shown in FIG. 9. At first, a transparent electrical-conductive oxide layer 114 is formed on the LED epi-layer which comprises the temporary substrate. Afterward, a plurality of ohmic contact channels 115 are defined by patterning the transparent electrical-conductive oxide layer 114 in terms of the lithography and dry etching steps. The ohmic contact channels are penetrated through the transparent electrical-conductive oxide layer 114, and then the ohmic contact channels 115 is refilled or semi-refilled with an ohmic contact metal film. Subsequently, a reflective metal film 116 is deposited on the transparent electrical-conductive oxide layer 114 including refilled those unfilled ohmic contact channels 115. As description before, the ohmic contact channels 115 are to provide good ohmic contact for current pass through the transparent electrical-conductive oxide layer 114. Preferably, the surface coverage of the ohmic contact channels 115 is of about 10% and below.

The benefits of the present invention are:

(1). to provide an LED chip structure with vertical current flow and requiring a single wire bonding that results in easy LED assembly and the manufacturing cost can be reduced.

(2). an LED chip size can be greatly reduced and compatible with the trend toward miniaturization, particularly in surface mount LED applications and saving the material cost.

(3). with good heat dissipation, therefore, the LED has better reliability performance and can be operated at much high current.

(4). very easy to mass-produce in higher yield and lower cost.

(5). the metal reflector can withstand higher temperature without reflectivity degradation, therefore, allowing more flexibility in chip processing.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure

What is claimed is:

1. A light emitting diode comprising:
   a heat & electrical-conductive substrate;
   a light emitting epi-layers;
   a transparent electrical-conductive oxide layer formed on said light emitting epi-layers, said transparent electrical-conductive oxide layer having a plurality of ohmic contact channels formed and penetrated through said transparent electrical-conductive oxide layer;
   a reflective metal layer formed on said transparent electrical-conductive oxide layer; and
   a metal bonding layer bonding said heat & electrical-conductive substrate with said reflective metal layer.

2. The light emitting diode according to claim 1, wherein said heat & electrical-conductive substrate is selected from the group consisting of copper, aluminum SiC, AlN, and silicon.

3. The light emitting diode according to claim 1, wherein said transparent electrical-conductive oxide layer is selected from the group consisting of $In_2O_3$, $SnO_2$, CdO, ZnO, ITO, CTO, $CuAlO_2$, $CuGaO_2$, and $SrCu_2O_2$.

4. The light emitting diode according to claim 1, wherein said reflective metal layer is selected from the group consisting of Au, Al and Ag, further, said metal bonding layer is selected from the group consisting of In, Au—Sn alloy, Au—Si alloy, Pb—Sn alloy, Au—Ge alloy, and PdIn.

5. The light emitting diode according to claim 1, further comprising a diffusion barrier layer formed in between said reflective metal layer and said metal bonding layer, further, said diffusion barrier layer is selected from the group consisting of electrical-conductive-oxide layer, refractory metal layer, and refractory metal silicide.

6. A light emitting diode comprising:
   a heat & electrical-conductive substrate;
   a light emitting epi-layers;
   a plurality of ohmic contact metal mesh or a grid pattern formed on said light emitting layers so as to uniformly distribute the injection current;
   a transparent electrical-conductive oxide layer formed on said light emitting epi-layers and said plurality of ohmic contact metal mesh or grid pattern;

a reflective metal layer formed on said transparent electrical-conductive oxide layer; and a metal bonding layer bonding said heat & electrical-conductive substrate with said reflective metal layer.

7. The light emitting diode according to claim 6, wherein said heat & electrical-conductive substrate is selected from the group consisting of copper, aluminum SiC, AlN, and silicon.

8. The light emitting diode according to claim 6, wherein said transparent electrical-conductive oxide layer is selected from the group consisting of $In_2O_3$, $SnO_2$, CdO, ZnO, ITO, CTO, $CuAlO_2$, $CuGaO_2$, and $SrCu_2O_2$.

9. The light emitting diode according to claim 6, wherein said reflective metal layer is selected from the group consisting of Au, Al and Ag, further, said metal bonding layer is selected from the group consisting of In, Au—Sn alloy, Au—Si alloy, Pb—Sn alloy, Au—Ge alloy, and PdIn.

10. The light emitting diode according to claim 6, further comprising a diffusion barrier layer formed in between said reflective metal layer and said metal bonding layer, further, said diffusion barrier layer is selected from the group consisting of electrical-conductive-oxide layer, refractory metal layer, and refractory metal silicide.

11. The light emitting diode according to claim 6, wherein said ohmic contact metal mesh or grid pattern has an area fraction lower than 10% of an area of an interface between said emitting epi-layers and said transparent electrical-conductive oxide layer.

* * * * *